(12) United States Patent
Igarashi et al.

(10) Patent No.: US 7,291,405 B2
(45) Date of Patent: *Nov. 6, 2007

(54) ORGANIC ELECTROLUMINESCENT DEVICE

(75) Inventors: Tatsuya Igarashi, Kanagawa (JP); Toshihiro Ise, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 191 days.

This patent is subject to a terminal disclaimer.

(21) Appl. No.: 10/738,307

(22) Filed: Dec. 18, 2003

(65) Prior Publication Data

US 2004/0137267 A1 Jul. 15, 2004

(30) Foreign Application Priority Data

Dec. 27, 2002 (JP) .......................... P.2002-382454

(51) Int. Cl.
*H01L 51/54* (2006.01)

(52) U.S. Cl. ...................... 428/690; 428/917; 313/504; 313/506; 257/40; 257/E51.041; 257/E51.043; 257/E51.044; 257/102; 257/103

(58) Field of Classification Search ..................... None
See application file for complete search history.

(56) References Cited

U.S. PATENT DOCUMENTS

| 5,755,999 A * | 5/1998 | Shi et al. ............... 252/301.16 |
| 2002/0125818 A1* | 9/2002 | Sato et al. ................... 313/504 |
| 2003/0144487 A1* | 7/2003 | Grushin et al. ............... 534/15 |
| 2003/0218417 A1* | 11/2003 | Sato et al. ................... 313/504 |

FOREIGN PATENT DOCUMENTS

| JP | 2002-305083 A | 10/2002 |
| WO | WO 01/93642 A1 * | 12/2001 |

* cited by examiner

*Primary Examiner*—Marie Yamnitzky
(74) *Attorney, Agent, or Firm*—Sughrue Mion Pllc.

(57) ABSTRACT

An organic electroluminescent device comprising: a pair of electrodes; and at least one organic compound layer between the pair of electrodes, the at least one organic compound layer including a light emitting layer, wherein the light emitting layer contains at least one host material and at least one luminescent material, and the host material is a metal complex containing a metal in groups 4 to 11 or periods 5 to 6 of a Periodic Table.

9 Claims, No Drawings

ORGANIC ELECTROLUMINESCENT DEVICE

FIELD OF THE INVENTION

This invention relates to an organic electroluminescent device (hereinafter abbreviated as "OELD") capable of converting electrical energy into light to emit light. The OELD of the invention is suited for use in the fields of display devices, displays, backlights, light sources for illumination, recording, exposure or reading, signs or signboards, interior decorations, optical communications, and so forth.

BACKGROUND OF THE INVENTION

OELDs have been actively studied and developed because of their capabilities of emitting light of high brightness at a low driving voltage. An OELD generally comprises a pair of opposing electrodes having therebetween a light emitting layer or a plurality of organic layers (layers containing an organic compound) including a light emitting layer. With an electric field applied to the opposing electrodes, electrons and positive holes are injected from the cathode and the anode, respectively, into the light emitting layer, where they are recombined to form excitons, which emit light. Otherwise, energy is transferred from the excitons to create excitons of other molecules, which emit light. The light thus emitted from the light emitting layer is utilized to display an image.

For the purpose of improving driving durability of OELDs, it has been proposed to use a metal complex as a host material in the light emitting layer as disclosed, e.g., in JP-A-2002-305083. There still has been room for further improvement on efficiency and durability.

SUMMARY OF THE INVENTION

An object of the present invention is to provide an OELD containing a metal complex containing a specific metal in the light emitting layer and thereby exhibiting improved luminescence efficiency and durability.

The object of the invention is accomplished by an OELD comprising a pair of electrodes and at least one organic compound layer including a light emitting layer provided in between the electrodes, the light emitting layer containing at least one host material and at least one luminescent material, wherein the host material is a metal complex containing a metal in groups 4 to 11 or periods 5 to 6 of the Periodic Table.

The object is also accomplished by preferred embodiments of the above-described OELD, in which:
(1) the host material contains a metal in groups 4 to 11 of the Periodic Table;
(2) the host material contains a metal in period 5 or 6 of the Periodic Table;
(3) the host material contains titanium, iron, manganese, nickel, copper, rubidium, strontium, zirconium, molybdenum, ruthenium, rhodium, palladium, silver, indium, tin, antimony, cesium, barium, a rare earth metal, tungsten, rhenium, osmium, iridium, platinum or gold;
(4) the host material is a compound selected from the group consisting of a compound represented by formula (I), a compound represented by formula (II), a compound represented by formula (III), a compound represented by formula (IV), a compound represented by formula (V), and a compound represented by formula (VI):

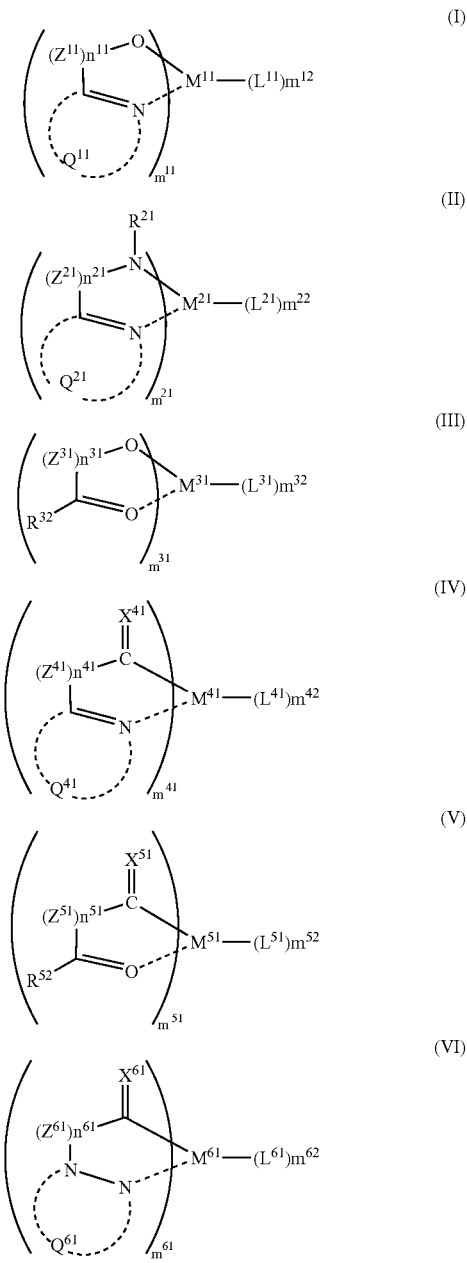

wherein $Q^{11}$, $Q^{21}$, $Q^{41}$, and $Q^{61}$ each represent an atomic group necessary to form a nitrogen-containing heterocyclic ring; $Z^{11}$, $Z^{21}$, $Z^{31}$, $Z^{41}$, $Z^{51}$, and $Z^{61}$ each represent a linking group $M^{11}$, $M^{21}$, $M^{31}$, $M^{41}$, $M^{51}$, and $M^{61}$ each represent an ion of a metal in groups 4 to 11 or periods 5 and 6 of the Periodic Table; $L^{11}$, $L^{21}$, $L^{31}$, $L^{41}$, $L^{51}$, and $L^{61}$ each represent a ligand; $R^{21}$, $R^{32}$, and $R^{52}$ each represent a hydrogen atom or a substituent; $X^{41}$, $X^{51}$, and $X^{61}$ each represent a substituted carbon atom or a substituted nitrogen atom; $n^{11}$, $n^{21}$, $n^{31}$, $n^{41}$, $n^{51}$, and $n^{61}$ each represent an integer of 0 to 2; $m^{11}$, $m^{21}$, $m^{31}$, $m^{41}$, $m^{51}$, and $m^{61}$ each represent an integer of 1 to 4; and $m^{12}$, $m^{22}$, $m^{32}$, $m^{42}$, $m^{52}$ and $m^{62}$ each represent an integer of 0 to 6;
(5) the luminescent material is a phosphorescent compound;
(6) the host material and the phosphorescent compound has a $T_1$ value of 60 kcal/mol (251 kJ/mol) or higher, and the phosphorescent compound emits phosphorescence having a peak wavelength ($\lambda_{max}$) of 550 nm or shorter;

(7) the phosphorescent compound is an iridium complex, a platinum complex, a rhenium complex, a ruthenium complex, a palladium complex, a rhodium complex or a rare earth complex; and/or (8) the at least one organic compound layer is at least three organic compound layers including a hole transporting layer, a light emitting layer, and an electron transporting layer, and the electron transporting layer contains a compound having an IP value (ionization potential) of 5.9 eV or higher.

The object of the invention is also accomplished by an OELD comprising a pair of electrodes and at least one organic compound layer including a light emitting layer provided in between the electrodes, the light emitting layer containing at least one host material and at least one phosphorescent compound, wherein the host material is a metal complex containing titanium, iron, manganese, nickel, copper, rubidium, strontium, zirconium, molybdenum, ruthenium, rhodium, palladium, silver, indium, tin, antimony, cesium, barium, a rare earth metal, tungsten, rhenium, osmium, iridium, platinum or gold.

The object of the invention is also accomplished by preferred embodiments of the above-described OELD, in which:

(1) the light emitting layer is free from a fluorescent compound, and the phosphorescent compound substantially emits light and/or (2) the host material is a compound selected from the group consisting of the above-described compounds represented by formulae (I) to (VI).

The object of the invention is also accomplished by preferred embodiments of the above-described OELDs, in which:

(1) the host material is a compound represented by formula (VII):

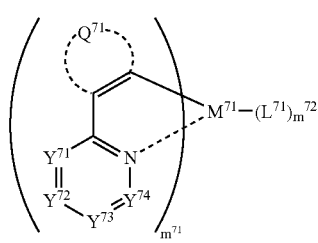

(VII)

wherein $Q^{71}$ represents a group necessary to form an aromatic ring; $M^{71}$ represents an ion of a metal in groups 4 to 11 or periods 5 and 6 of the Periodic Table; $L^{71}$ represents a ligand; $Y^{71}$, $Y^{72}$, $Y^{73}$, and $Y^{74}$ each represent a substituted or unsubstituted carbon atom or a nitrogen atom; $m^{71}$ represents an integer of 1 to 4; and $m^{72}$ represents an integer of 0 to 6;

(2) the host material is a compound represented by formula (VIII):

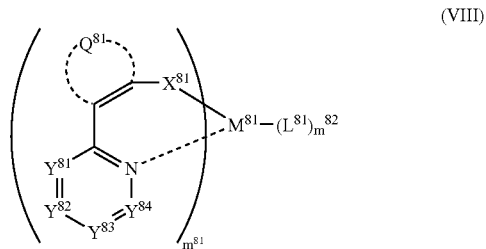

(VIII)

wherein $Q^{81}$ represents a group necessary to form an aromatic ring; $M^{81}$ represents an ion of a metal in groups 4 to 11 or periods 5 and 6 of the Periodic Table; $L^{81}$ represents a ligand; $Y^{81}$, $Y^{82}$, and $Y^{83}$ each represent a substituted or unsubstituted carbon atom or a nitrogen atom; $X^{81}$ represents an oxygen atom, a sulfur atom or a substituted or unsubstituted nitrogen atom; $m^{81}$ represents an integer of 1 to 4; and $m^{82}$ represents an integer of 0 to 6;

(3) the host material is a compound represented by formula (IX):

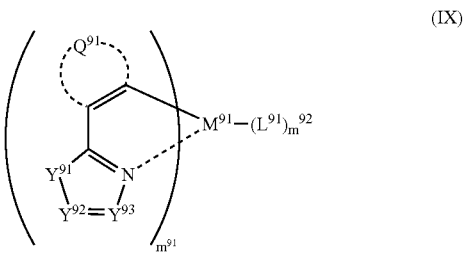

(IX)

wherein $Q^{91}$ represents a group necessary to form an aromatic ring; $M^{91}$ represents an ion of a metal in groups 4 to 11 or periods 5 and 6 of the Periodic Table; $L^{91}$ represents a ligand; $Y^{91}$ represents an oxygen atom, a substituted or unsubstituted carbon atom or a substituted or unsubstituted nitrogen atom; $Y^{92}$ and $Y^{93}$ each represent a substituted or unsubstituted carbon atom or a nitrogen atom; $m^{91}$ represents an integer of 1 to 4; and $m^{92}$ represents an integer of 0 to 6;

(4) the host material is a compound represented by formula (X):

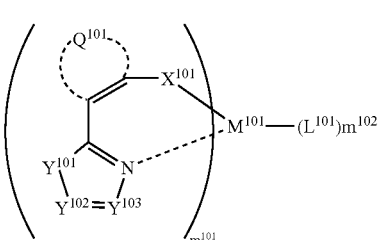

(X)

wherein $Q^{101}$ represents a group necessary to form an aromatic ring; $M^{101}$ represents an ion of a metal in groups 4 to 11 or periods 5 and 6 of the Periodic Table; $L^{101}$ represents a ligand; $Y^{101}$ represents an oxygen atom, a substituted or unsubstituted carbon atom or a substituted or unsubstituted nitrogen atom; $Y^{102}$ and $Y^{103}$ each represent a substituted or unsubstituted carbon atom or a nitrogen atom; $X^{101}$ represents an oxygen atom, a sulfur atom or a substituted or unsubstituted nitrogen atom; $m^{101}$ represents an integer of 1 to 4; and $m^{102}$ represents an integer of 0 to 6;

(5) the host material is a compound represented by formula (XI):

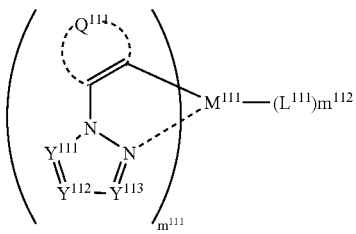

wherein $Q^{111}$ represents a group necessary to form an aromatic ring; $M^{111}$ represents an ion of a metal in groups 4 to 11 or periods 5 and 6 of the Periodic Table; $L^{111}$ represents a ligand; $Y^{111}$, $Y^{112}$, and $Y^{113}$ each represent a substituted or unsubstituted carbon atom or a nitrogen atom; $m^{111}$ represents an integer of 1 to 4; and $m^{112}$ represents an integer of 0 to 6;

(6) the host material is a compound represented by formula (XII):

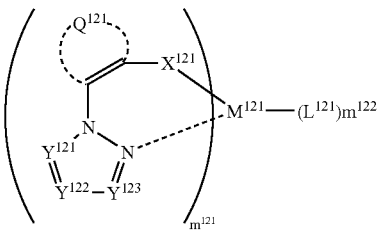

wherein $Q^{121}$ represents a group necessary to form an aromatic ring; $M^{121}$ represents an ion of a metal in groups 4 to 11 or periods 5 and 6 of the Periodic Table; $L^{121}$ represents a ligand; $Y^{121}$, $Y^{122}$, and $Y^{123}$ each represent a substituted or unsubstituted carbon atom or a nitrogen atom; $X^{121}$ represents an oxygen atom, a sulfur atom or a substituted or unsubstituted nitrogen atom; $m^{121}$ represents an integer of 1 to 4; and $m^{122}$ represents an integer of 0 to 6;

(7) the light emitting layer contains at least two host materials;

(8) at least one of the host materials is an arylamine derivative;

(9) at least one of the host materials is an aromatic hydrocarbon compound;

(10) at least one of the host materials is an aromatic nitrogen-containing heterocyclic compound;

(11) at least one of the host materials is a metal complex;

DETAILED DESCRIPTION OF THE INVENTION

The OELD of the present invention is a device having at least one organic compound layer (also called an organic layer) including a light emitting layer between a pair of electrodes, an anode and a cathode. The light emitting layer contains at least one host material and at least one luminescent material. The OELD is characterized in that the host material is a metal complex containing a metal in groups 4 to 11 or periods 5 or 6 of the Periodic Table.

The terminology "host material" as used herein means a compound which primarily performs a function of injecting and transporting charges in the light emitting layer and which per se does not substantially emit light. The term "does not substantially emit light" means, preferably 5% or less of the total emission intensity, more preferably 3% or less of the total emission intensity, and still more preferably 1% or less of the total emission intensity. The host material concentration in the light emitting layer is not particularly limited. The host material is preferably the major component (component having a highest content) of the light emitting layer nevertheless. A preferred proportion of the host material in the light emitting layer is 50 to 99.9% by weight, desirably 70 to 99.8% by weight, more desirably 80 to 99.7% by weight, most desirably 90 to 99.5% by weight.

The host material of the invention preferably has a glass transition temperature (Tg) of 100° to 500° C., desirably 110° to 300° C., more desirably 120° to 250° C.

The center metal of the metal complex, which is the host material, is selected from the metals in groups 4 to 11 and the metals in periods 5 to 6 of the Periodic Table, preferably the metals in groups 4 to 11, still preferably the metals in groups 4 and 11 and period 5 or 6. Specifically, preferred metals include titanium, iron, manganese, nickel, copper, rubidium, strontium, zirconium, molybdenum, ruthenium, rhodium, palladium, silver, indium, tin, antimony, cesium, barium, rare earth metals, tungsten, rhenium, osmium, iridium, platinum, and gold. Still preferred metals are rhodium, palladium, barium, cerium, thulium, gadolinium, rhenium, iridium, and palladium. Particularly preferred are rhodium, palladium, rhenium, iridium, and platinum. Rhodium and palladium are the most preferred.

The host material is preferably a metal complex having a polydentate ligand, particularly a bidentate ligand which coordinates to a metal ion at its two nitrogen atoms, a bidentate ligand which coordinates at its nitrogen atom and oxygen atom, a bidentate ligand which coordinates at its two oxygen atoms, a bidentate ligand which coordinates at its carbon atom and nitrogen atom, or a bidentate ligand which coordinates at its carbon atom and oxygen atom. The host material is more preferably a compound represented by formula (I), a compound represented by formula (II), a compound represented by formula (III), a compound represented by formula (IV), a compound represented by formula (V) or a compound represented by formula (VI). The host material is especially preferably a compound represented by formula (VII), a compound represented by formula (VIII), a compound represented by formula (IX), a compound represented by formula (X), a compound represented by formula (XI) or a compound represented by formula (XII).

In formula (I), $Q^{11}$ represents an atomic group necessary to form a nitrogen-containing heterocyclic ring together with the adjacent nitrogen and carbon atoms. The heterocyclic group completed by $Q^{11}$ may have a substituent. The substituent that may be possessed by $Q^{11}$ includes an alkyl group (preferably having 1 to 30 carbon atoms, still preferably 1 to 20 carbon atoms, particularly preferably 1 to 10 carbon atoms, such as methyl, ethyl, isopropyl, t-butyl, n-octyl, n-decyl, n-hexadecyl, cyclopropyl, cyclopentyl or cyclohexyl), an alkenyl group (preferably having 2 to 30 carbon atoms, still preferably 2 to 20 carbon atoms, particularly preferably 2 to 10 carbon atoms, such as vinyl, allyl, 2-butenyl or 3-pentenyl), an alkynyl group (preferably having 2 to 30 carbon atoms, still preferably 2 to 20 carbon atoms, particularly preferably 2 to 10 carbon atoms, such as propargyl or 3-pentynyl), an aryl group (preferably having 6 to 30 carbon atoms, still preferably 6 to 20 carbon atoms, particularly preferably 6 to 12 carbon atoms, such as phenyl, p-methylphenyl, naphthyl or anthranyl), an acyl group (preferably having 1 to 30 carbon atoms, still preferably 1 to 20 carbon atoms, particularly preferably 1 to 12 carbon atoms, such as acetyl, benzoyl, formyl or pivaloyl), a sulfonyl group (preferably having 1 to 30 carbon atoms, still preferably 1 to 20 carbon atoms, particularly preferably 1 to 12 carbon atoms, such as mesyl or tosyl), a heterocyclic group (preferably having 1 to 30 carbon atoms, still preferably 1 to 12 carbon atoms, and containing at least one of nitrogen, oxygen, and sulfur, such as imidazolyl, pyridyl, quinolyl, furyl, thienyl, piperidyl, morpholino, benzoxazolyl, benzimidazolyl, benzothiazolyl, carbazolyl or azepinyl), and a silyl group (preferably having 3 to 40 carbon atoms, still preferably 3 to 30 carbon atoms, particularly preferably 3 to 24 carbon atoms, such as trimethylsilyl or triphenylsilyl. These substituents may be substituted.

The nitrogen-containing heterocyclic ring completed by $Q^{11}$ is preferably an aromatic nitrogen-containing heterocyclic ring. Preferred examples of the ring include a pyrrole ring, a pyrazole ring, an imidazole ring, a triazole ring, an oxazole ring, a thiazole ring, an oxadiazole ring, a thiadiazole ring, a pyridine ring, a pyrazine ring, a pyrimidine ring, and condensed rings containing any of these heterocyclic rings (e.g., a benzoxazole ring, a quinoline ring, and a pyrizoimidazole ring). Still preferred are a pyrazole ring, an imidazole ring, a pyridine ring, a pyrazine ring, a pyrimidine ring, and condensed rings containing any of them. Particularly preferred are a pyridine ring and condensed rings containing a pyridine ring.

$Z^{11}$ represents a linking group, including an alkylene group, an alkenylene group, an oxygen link, a sulfur link, a nitrogen link, a carbonyl group, a sulfonyl group, a sulfoxide group, an arylene group, a heterocyclic linking group. $Z^{11}$ is preferably an alkylene group, an alkenylene group, a carbonyl group, an arylene group or a heteroarylene group. $Z^{11}$ is still preferably an alkenylene group, a carbonyl group or an arylene group.

$M^{11}$ represents an ion of a metal in groups 4 to 11 or periods 5 and 6 of the Periodic Table. It is anion of the metal previously recited as a center metal of the metal complex serving as a host material of the present invention. That is, $M^{11}$ is preferably a titanium ion, an iron ion, a manganese ion, a nickel ion, a copper ion, a rubidium ion, a strontium ion, a zirconium ion, a molybdenum ion, a ruthenium ion, a rhodium ion, a palladium ion, a silver ion, an indium ion, a tin ion, an antimony ion, a cesium ion, a barium ion, a rare earth metal ion, a tungsten ion, a rhenium ion, an osmium ion, an iridium ion, a platinum ion or a gold ion. $M^{11}$ is still preferably a rhodium ion, a palladium ion, a barium ion, a cerium ion, a thulium ion, a gadolinium ion, a rhenium ion, an iridium ion or a palladium ion. $M^{11}$ is particularly preferably a rhodium ion, a palladium ion, a rhenium ion, an iridium ion or a platinum ion. A rhodium ion or a palladium ion is the most preferred.

$L^{11}$ represents a ligand. Useful ligands include those described, e.g., in H. Yersin, *Photochemistry and Photophysics of Coordination Compounds*, Springer-Verlag, 1987, pp. 71-77 and 135-146 and Yamamoto Akio, *Yukikinzokukagaku-kiso to ohyo*, Shokabo Publishing Co., 1982. Suitable ligands include halide ions (preferably Cl⁻ and F⁻), nitrogen-containing heterocyclic ligands (e.g., bipyridyl, phenanthroline, phenylpyridine, pyrazolylpyridine, and benzimidazolylpyridine), diketone ligands, nitrile ligands, carbonyl ligands, isonitrile ligands, phosphorus ligands (e.g., phosphine derivative, phosphorous ester derivative, and phosphinine derivative), and carboxylic acid ligands (e.g., acetic acid). Preferred ligands are bidentate nitrogen-containing heterocyclic ligands (e.g., bipyridyl, phenanthroline, phenylpyridine, pyrazolylpyridine, benzimidazolylpyridine, and picolinic acid), and diketone ligands (e.g., acetylacetone). The ligands shown on the left side of the formulae (I) to (XII), the numbers of which are indicated by $m^{11}$, $m^{21}$, $m^{31}$, $m^{41}$, $m^{51}$, $m^{61}$, $m^{71}$, $m^{81}$, $m^{91}$, $m^{101}$, $m^{111}$, and $m^{121}$, respectively, are also useful as $L^{11}$.

$n^{11}$ represents an integer of 0 to 2, preferably 1 or 2. When $n^{11}$ is 2, the two linking groups ($Z^{11}$) may be the same or different.

$m^{11}$ represents an integer of 1 to 4, preferably 1 to 3, still preferably 1 or 2.

$m^{12}$ represents an integer of 0 to 6, preferably 0 to 3, still preferably 0 to 2, particularly preferably 0 or 1.

In formula (II), $Q^{21}$, $M^{21}$, $L^{21}$, $n^{21}$, $m^{21}$, and $m^{22}$ have the same meaning as $Q^{11}$, $M^{11}$, $L^{11}$, $n^{11}$, $m^{11}$, and $m^{12}$ in formula (I), respectively. Preferred ranges of the latter also apply to the former.

$Z^{21}$ represents a linking group, including an alkylene group, an alkenylene group, an oxygen link, a sulfur link, a nitrogen link, a carbonyl group, a sulfonyl group, a sulfoxide group, an arylene group, and a heterocyclic linking group. $Z^{21}$ may be connected to $R^{21}$ to form a nitrogen-containing heterocyclic ring, such as a pyrazole ring or an imidazole ring.

$Z^{21}$ is preferably an alkylene group, an alkenylene group, a carbonyl group, an arylene group, a heteroarylene group or a group which is connected to $R^{21}$ to form a nitrogen-containing heterocyclic ring. $Z^{21}$ is still preferably an alkenylene group, a carbonyl group, an arylene group or a group which is connected to $R^{21}$ to form a nitrogen-containing heterocyclic ring.

$R^{21}$ represents a hydrogen atom or a substituent. $Z^{21}$ may be connected to $Z^{21}$ to form a nitrogen-containing heterocyclic ring. The substituent represented by $R^{21}$ includes an alkyl group, an aryl group, a heteroaryl group, an acyl group (e.g., acetyl, benzoyl or trifluoroacetyl), a sulfonyl group (e.g., methanesulfonyl or pentafluorobenzenesulfonyl), a hydroxyl group, an alkoxy group, an amino group, and an imino group. These substituents may have a substituent selected from, for example, those previously recited as substituents on $Q^{11}$. $R^{21}$ is preferably an acyl group, a sulfonyl group or a group which is connected to $Z^{21}$ to form a nitrogen-containing heterocyclic group, still preferably a group which is connected to $Z^{21}$ to form a nitrogen-containing heterocyclic group.

In formula (III), $Z^{31}$, $M^{31}$, $L^{31}$, $n^{31}$, $m^{31}$, and $m^{32}$ have the same meanings as $Z^{11}$, $M^{11}$, $L^{11}$, $n^{11}$, $m^{11}$, and $m^{12}$, respectively. Preferred ranges of the former are the same as for the latter.

$R^{32}$ represents a hydrogen atom or a substituent. The substituent as $R^{32}$ includes those enumerated as a substituent on $Q^{11}$. $R^{32}$ is preferably an alkyl group, an aryl group, a heteroaryl group, an alkoxy group or an amino group, still preferably an alkyl group, an aryl group or a heteroaryl group, particularly preferably an alkyl group.

In formula (IV), $Q^{41}$, $M^{41}$, $L^{41}$, $n^{41}$, $m^{41}$, and $m^{42}$ have the same meaning as $Q^{11}$, $M^{11}$, $L^{11}$, $n^{11}$, $m^{11}$, and $m^{12}$ in formula (I) respectively. Preferred ranges of the latter also apply to the former.

$Z^{41}$ represents a linking group, including an alkylene group, an alkenylene group, an oxygen link, a sulfur link, a nitrogen link, a carbonyl group, a sulfonyl group, a sulfoxide group, an arylene group, and a heterocyclic linking group. $Z^{41}$ may be connected to $X^{41}$ to form a ring (e.g., benzene, cyclohexene or pyridine). $Z^{41}$ is preferably an alkylene group, an alkenylene group, a carbonyl group, an arylene group, a heteroarylene group or a group which is connected to $X^{41}$ to form a ring, still preferably an alkenylene group, a carbonyl group, an arylene group or a group which is connected to $X^{41}$ to form a ring, particularly preferably a group which is connected to $X^{41}$ to form an aromatic ring.

$X^{41}$ represents a substituted carbon atom or a substituted nitrogen atom. The substituent of the substituted carbon atom includes those recited as for the substituents on $Q^{11}$. The substituent of the substituted nitrogen atom includes those recited as for the substituent represented by $R^{21}$. $X^{41}$ may be taken together with $Z^{41}$ to form a ring, such as a benzene ring, a cyclohexene ring or a pyridine ring.

$X^{41}$ is preferably a substituted carbon atom or a group which is connected to $Z^{41}$ to form a ring, still preferably a group which is connected to $Z^{41}$ to form an aromatic ring.

In formula (V), $R^{52}$, $Z^{51}$, $X^{51}$, $M^{51}$, $L^{51}$, $n^{51}$, $m^{51}$, and $m^{52}$ have the same meaning as $R^{32}$, $Z^{41}$, $X^{41}$, $M^{41}$, $L^{41}$, $n^{41}$, $m^{41}$, and $m^{42}$, respectively. Preferred ranges of the former are the same as for the latter.

In formula (VI), $M^{61}$, $L^{61}$, $X^6$, $n^{61}$, $m^{61}$, and $m^{62}$ have the same meaning as $M^{11}$, $L^{11}$, $X^{41}$, $n^{11}$, $m^{11}$, and $m^{12}$, respectively. Preferred ranges of the latter also apply to the former.

$Q^{61}$ represents a group necessary to form a nitrogen-containing heterocyclic ring. $Q^{61}$ may have a substituent, which is preferably selected from the substituents that may be possessed by $Q^{11}$. The heterocyclic ring completed by $Q^{61}$ preferably includes a pyrazole ring (inclusive of a condensed ring thereof) and a triazole ring. A pyrazole ring is still preferred.

In formula (VII), $M^{71}$, $L^{71}$, $m^{71}$, and $m^{72}$ have the same meaning as $M^{11}$, $L^{11}$, $m^{11}$, and $m^{12}$, respectively. Preferred ranges of the latter also apply to the former.

$Q^{71}$ represents a group necessary to form an aromatic ring. The aromatic ring completed by $Q^{71}$ preferably includes an aromatic hydrocarbon ring (e.g., benzene, naphthalene, phenanthrene, anthracene, triphenylene or pyrene), an aromatic nitrogen-containing heterocyclic ring (e.g., pyridine, pyrazine, pyrrole, pyrazole, quinoline or indole), an aromatic sulfur-containing heterocyclic ring (e.g., thiophene or benzothiophene), and an aromatic oxygen-containing heterocyclic ring (e.g., furan), still preferably an aromatic hydrocarbon ring and an aromatic nitrogen-containing ring, particularly preferably an aromatic hydrocarbon ring.

$Y^{71}$, $Y^{72}$, $Y^{73}$, and $Y^{74}$ each represent a substituted or unsubstituted carbon atom or a nitrogen atom. The substituents of the substituted carbon atoms may be connected together to form a condensed ring (e.g., quinoline or isoquinoline). $Y^{71}$, $Y^{72}$, $Y^{73}$, and $Y^{74}$ each preferably represent a substituted or unsubstituted carbon atom.

In formula (VIII), $Q^{81}$, $M^{81}$, $L^{81}$, $Y^{81}$, $Y^{82}$, $Y^{83}$, $Y^{84}$, $m^{81}$, and $m^{82}$ have the same meaning as $Q^{71}$, $M^{71}$, $L^{71}$, $Y^{71}$, $Y^{72}$, $Y^{73}$, $Y^{74}$, $m^{71}$, and $m^{72}$ respectively. Preferred ranges of the latter also apply to the former.

$X^{81}$ represents an oxygen atom, a sulfur atom or a substituted or unsubstituted nitrogen atom, preferably an oxygen atom or a substituted nitrogen atom, still preferably an oxygen atom. The substituent the nitrogen atom may have preferably includes a substituted acyl group and a substituted sulfonyl group.

In formula (IX), $Q^{91}$, $M^{91}$, $M^{91}$, $L^{91}$, $m^{91}$, and $m^{92}$ have the same meaning as $Q^{71}$, $M^{71}$, $L^{71}$, $m^{71}$, and $m^{72}$, respectively. Preferred ranges of the former are the same as for the latter.

$Y^{91}$ represents an oxygen atom, a substituted or unsubstituted carbon atom or a substituted or unsubstituted nitrogen atom, preferably a substituted nitrogen atom. The substituent the carbon atom or nitrogen atom may have preferably includes an alkyl group, an aryl group, and a heteroaryl group.

$Y^{92}$ and $Y^{93}$ each represent a substituted or unsubstituted carbon atom or a nitrogen atom. The substituents of the substituted carbon atoms may be taken together to form a condensed ring (e.g., benzene condensed ring or pyridine condensed ring). $Y^{92}$ and $Y^{93}$ each preferably represent a substituted carbon atom. Still preferably the substituents of $Y^{92}$ and $Y^{93}$ are connected together to form an aromatic ring.

In formula (X), $Q^{101}$, $M^{101}$, $L^{101}$, $Y^{101}$, $Y^{102}$, $Y^{103}$, $X^{101}$, $m^{101}$, and $m^{102}$ have the same meaning as $Q^{71}$, $M^{71}$, $L^{71}$, $Y^{91}$, $Y^{92}$, $Y^{93}$, $X^{81}$, $m^{71}$, and $m^{72}$, respectively. Preferred ranges of the latter also apply to the former.

In formula (XI), $Q^{111}$, $M^{111}$, $L^{111}$, $m^{111}$, and $m^{112}$ have the same meaning as $Q^{71}$, $M^{71}$, $L^{71}$, $m^{71}$, and $m^{72}$, respectively. Preferred ranges of the latter also apply to the former.

$Y^{111}$, $Y^{112}$, and $Y^{113}$ each represent a substituted or unsubstituted carbon atom or a nitrogen atom, preferably a substituted or unsubstituted carbon atom.

In formula (XII), $Q^{121}$, $M^{121}$, $Y^{121}$, $Y^{122}$, $Y^{123}$, $X^{121}$, $m^{121}$, and $m^{122}$ have the same meaning as $Q^{71}$, $M^{71}$, $L^{71}$, $Y^{111}$, $Y^{112}$, $Y^{113}$, $X^{81}$, $m^{71}$, and $m^{72}$, respectively. Preferred ranges of the latter also apply to the former.

Additionally, the compounds represented by formulae (1) through (10) described in JP-A-2001-247859 are also preferably used as a metal complex.

The terminology "luminescent material" as used herein means a compound which substantially performs a light emitting function in the light emitting layer. The luminescence may be either fluorescence or phosphorescence or both. Nevertheless, the luminescent material is preferably a phosphorescent compound which substantially emits phosphorescent radiation in the light emitting layer. It is still preferred that the light emitting layer contain no fluorescent compound and emits light substantially from the phosphorescent material.

The luminescent material concentration in the light emitting layer is not particularly limited but is preferably equal to or lower than the host material concentration. A preferred proportion of the luminescent material in the light emitting layer is 0.1 to 50% by weight, desirably 0.2 to 30% by weight, more desirably 0.3 to 20% by weight, most desirably 0.5 to 10% by weight.

The phosphorescent compound includes, but is not limited to, transition metal complexes, preferably iridium complexes, platinum complexes, rhenium complexes, ruthenium complexes, palladium complexes, rhodium complexes, and rare earth complexes, still preferably iridium complexes and platinum complexes. The ortho-carbometalated iridium complexes having a difluorophenylpyridine ligand which are disclosed in JP-A-2002-235076, JP-A-2002-170684, and Japanese Patent Application Nos. 2001-239281 and 2001-248165 are preferred.

The phosphorescent compounds described in the following literature are also preferably used in the invention: U.S. Pat. Nos. 6,303,238B1 and 6,097,147, WO 00/57676, WO 00/70655, WO 01/08230, WO 01/39234A2, WO 01/41512A1, WO 02/02714A2, WO 02/15645A1, JP-A-2001-247859, Japanese Patent Application No. 2000-33561, JP-A-2002-117978, Japanese Patent Application No. 2001-248165, JP-A-2002-235076, Japanese Patent Application No. 2001-239281, JP-A-2002-170684, EP 1211257, JP-A-2002-226495, JP-A-2002-234894, JP-A-2001-247859, JP-A-2001-298470, JP-A-2002-173674, JP-A-2002-203678, and JP-A-2002-203679.

The phosphorescence life time of the phosphorescent compound to be used is not particularly limited but is preferably 1 ms or shorter, still preferably 100 μs or shorter, particularly preferably 10 μs or shorter, at room temperature.

It is preferred that the host material and the phosphorescent compound have a $T_1$ value (an energy value of lowest triplet excited state) of 60 kcal/mol (251 kJ/mol) or higher and that the phosphorescent compound emits phosphorescence having a peak wavelength ($\lambda_{max}$) of 550 nm or shorter. It is still preferred that the host material and the phosphorescent compound have a $T_1$ value of 62 kcal/mol (251 kJ/mol) or higher and that the phosphorescent compound emits phosphorescence having a peak wavelength ($\lambda_{max}$) of 500 nm or shorter. It is particularly preferred that the host material and the phosphorescent compound have a $T_1$ value of 65 kcal/mol (251 kJ/mol) or higher and that the phosphorescent compound emits phosphorescence having a peak wavelength ($\lambda_{max}$) of 480 nm or shorter.

It is preferred that the OELD of the invention has at least three organic compound layers including a hole transporting layer, a light emitting layer, and an electron transporting layer and that the electron transporting layer has an IP (ionization potential) value of 5.9 eV or higher. The IP value of the electron transporting layer is still preferably 6.0 eV or higher, particularly preferably 6.1 eV or higher.

The OELD may contain other host materials in combination with the metal complex according to the present invention. Containing two ore more kinds of host materials may be preferable to improve the driving durability. Other useful host materials include arylamine derivatives (e.g., triphenylamine derivatives and benzidine derivatives), aromatic hydrocarbon compounds (e.g., triphenylbenzene derivatives, triphenylene derivatives, phenanthrene derivatives, naphthalene derivatives, and tetraphenylene derivatives), aromatic nitrogen-containing heterocyclic compounds (e.g., pyridine derivatives, pyrazine derivatives, pyrimidine derivatives, triazine derivatives, pyrazole derivatives, imidazole derivatives, oxazole derivatives, and pyrrole derivatives), and metal complexes (e.g., zinc complexes, aluminum complexes, and gallium complexes).

The host material and the luminescent material may be either low molecular compounds or oligomeric or polymeric compounds. The oligomeric or polymeric compounds preferably have a polystyrene equivalent weight average molecular weight of 1,000 to 5,000,000, particularly 2,000 to 1,000,000, especially 3,000 to 100,000. The polymeric host materials, which maybe either homopolymers or copolymers, include polymers containing the structure represented by formula (I), (II), (III), (IV), (V), (VI), (VII) (VIVIII), (IX), (X), (XI), or (XII) in the main chain or the side chain thereof. The compound of the invention (host material and the luminescent material) is preferably a low molecular compound.

Specific butnon-limiting examples of the compounds (host material) of the invention are shown below. In the examples, "Ph" represents a phenyl group.

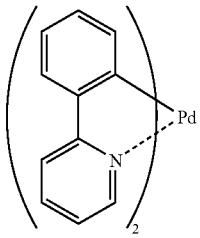

(1-1)

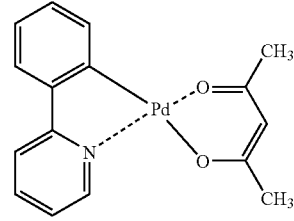

(1-2)

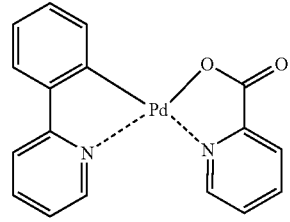

(1-3)

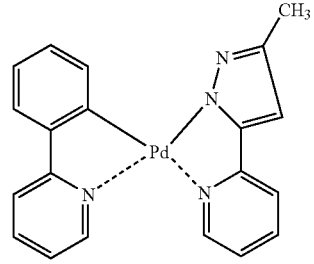

(1-4)

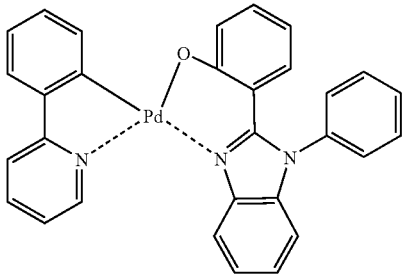

(1-5)

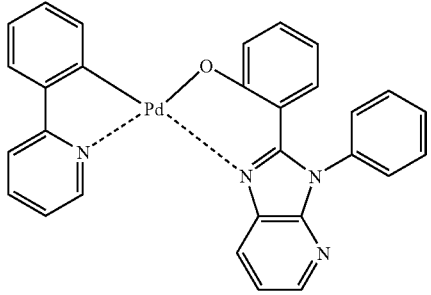

(1-6)

-continued
(1-7)
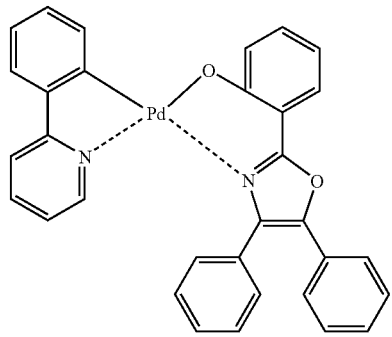
(1-8)
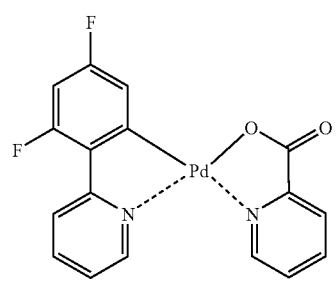
(1-9)
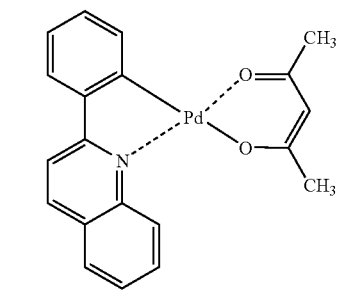
(1-10)
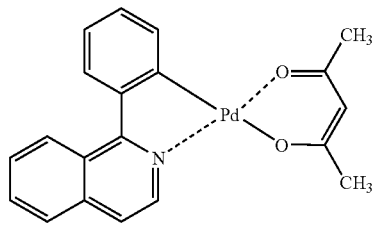
(1-11)
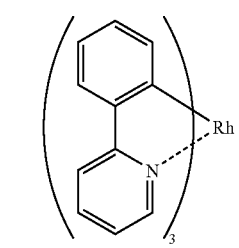
(1-12)
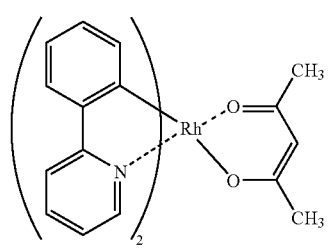
-continued
(1-13)
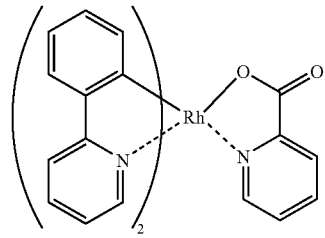
(1-14)
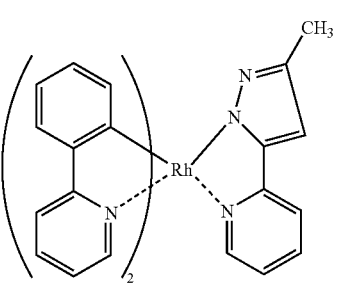
(1-15)
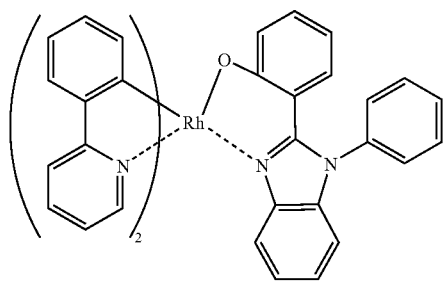
(1-16)
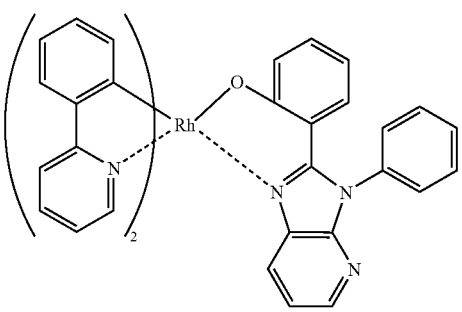
(1-17)
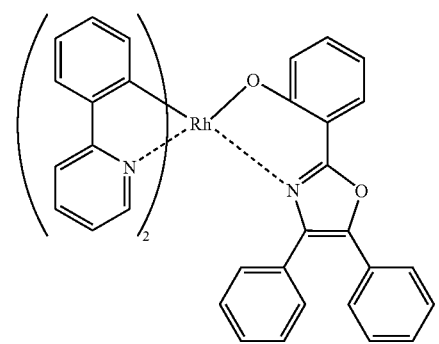

-continued
(1-18)
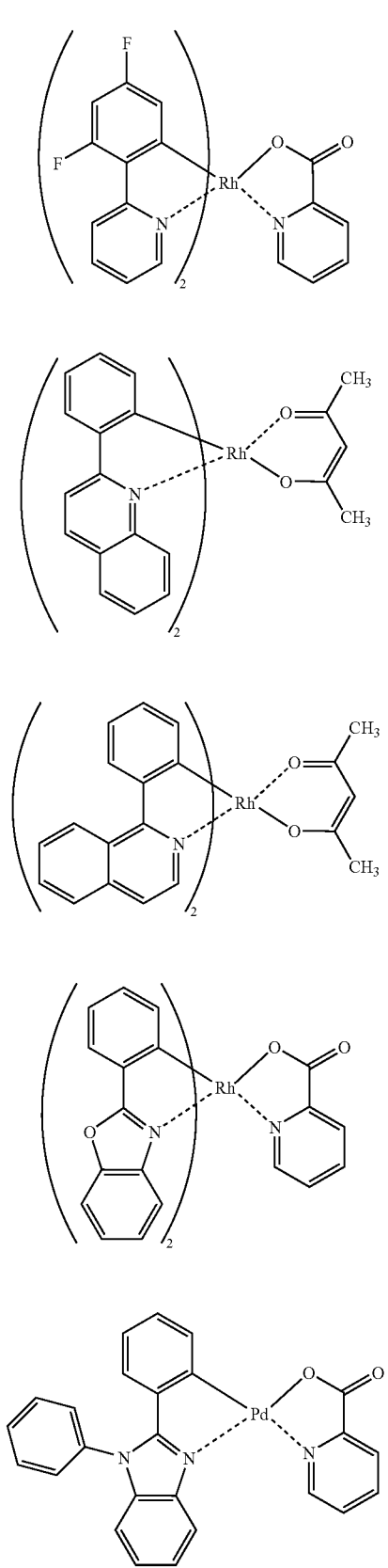
(1-19)
(1-20)
(1-21)
(1-22)
-continued
(1-23)
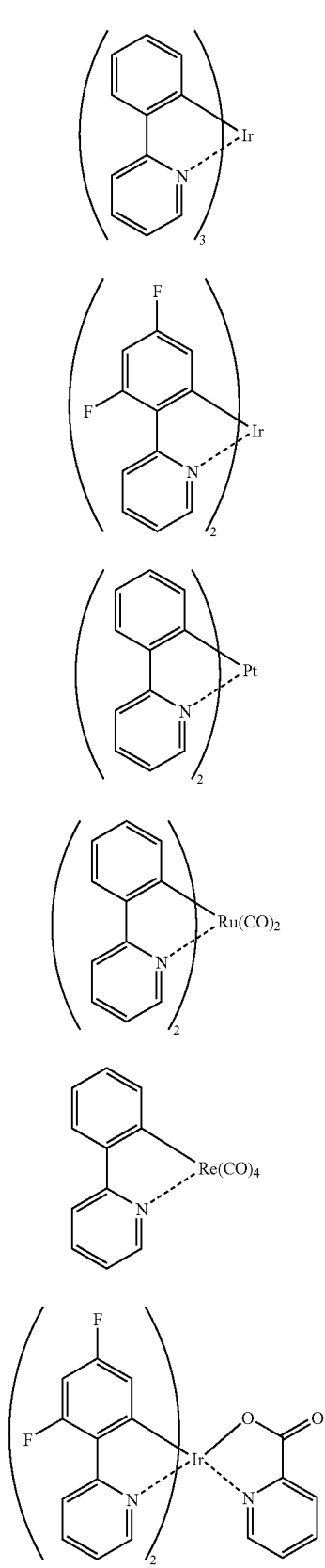
(1-24)
(1-25)
(1-26)
(1-27)
(1-28)

-continued
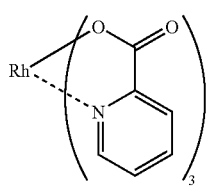 (1-29)
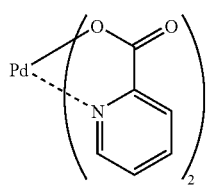 (1-30)
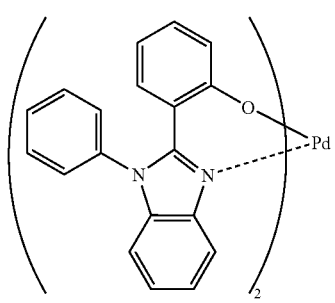 (1-31)
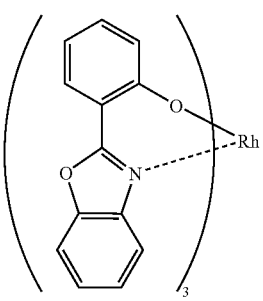 (1-32)
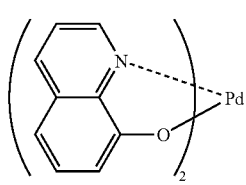 (1-33)
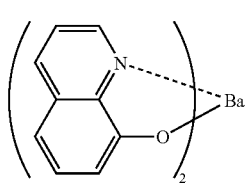 (1-34)
-continued
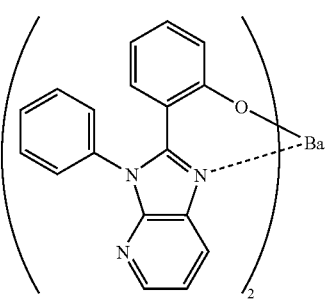 (1-35)
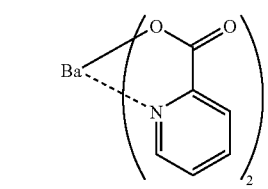 (1-36)
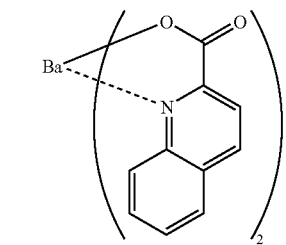 (1-37)
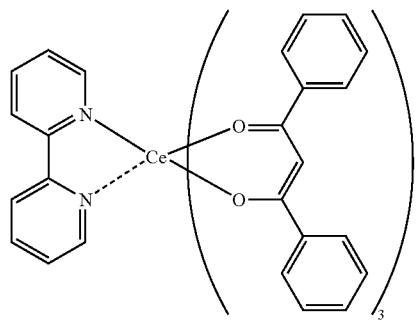 (1-38)
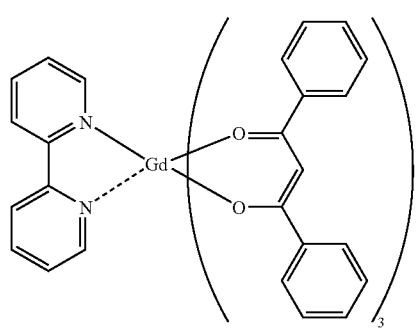 (1-39)

-continued
(1-40)
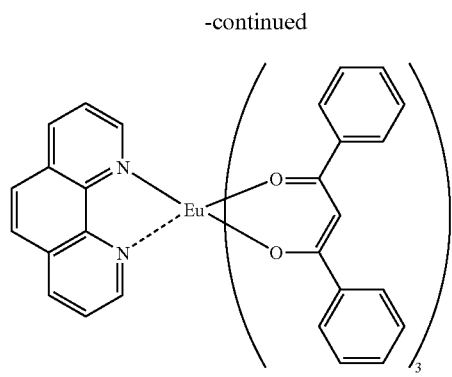
(1-41)
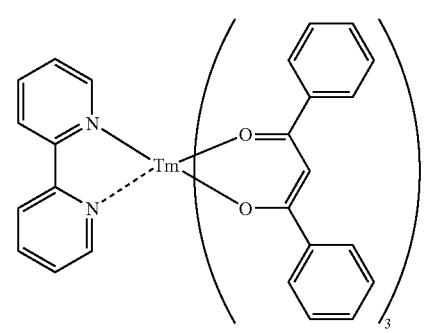
(1-42)
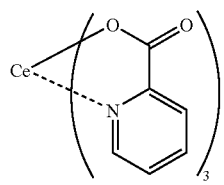
(1-43)
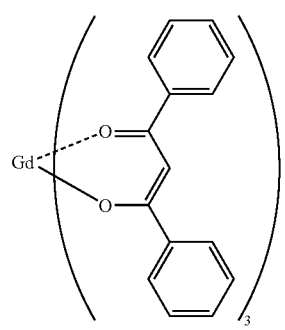
(1-44)
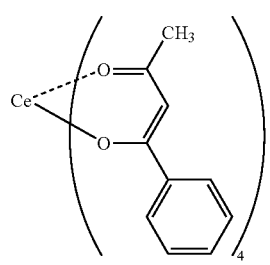
-continued
(1-45)
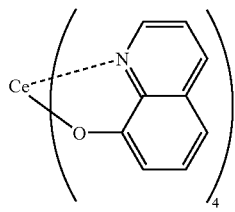
(1-46)
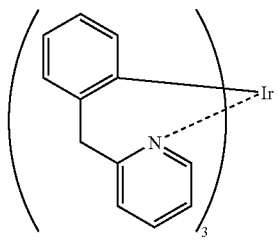
(1-47)
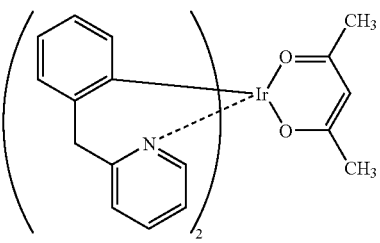
(1-48)
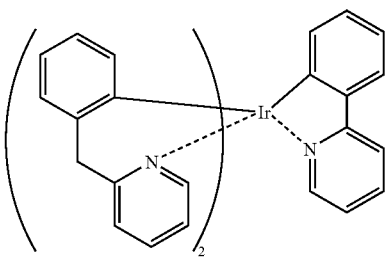
(1-49)
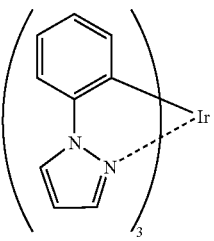
(1-50)
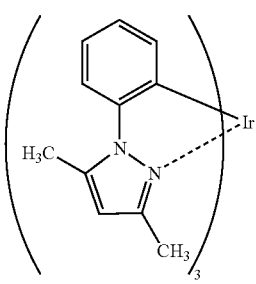

(1-51)
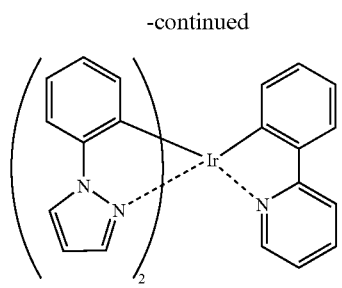
(1-52)
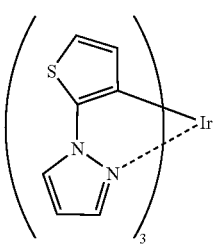
(1-53)
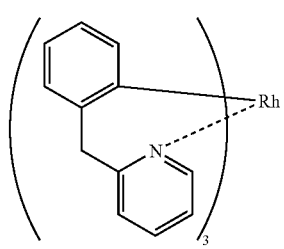
(1-54)
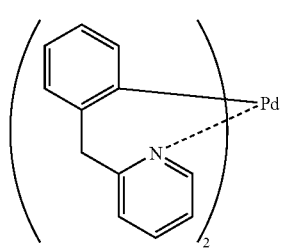
(1-55)
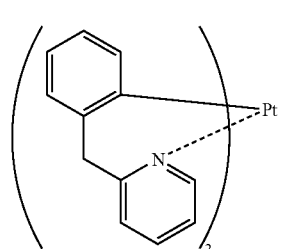
(1-56)
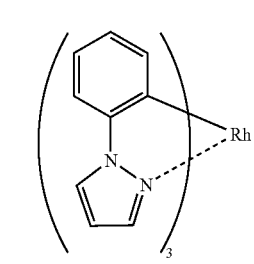
(1-57)
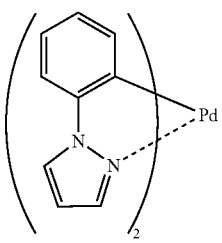
(1-58)
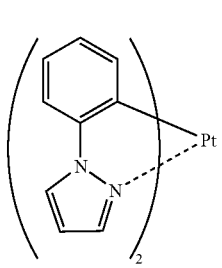
(1-59)
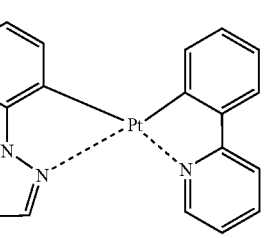
(1-60)
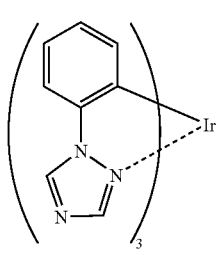
(1-61)
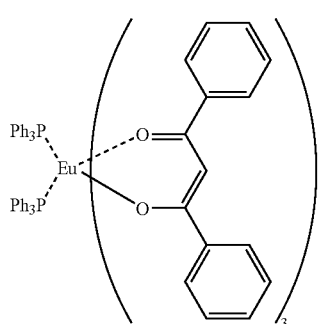
(1-62)
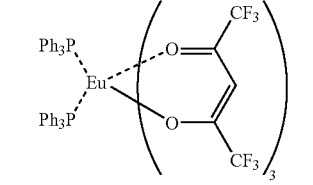

-continued

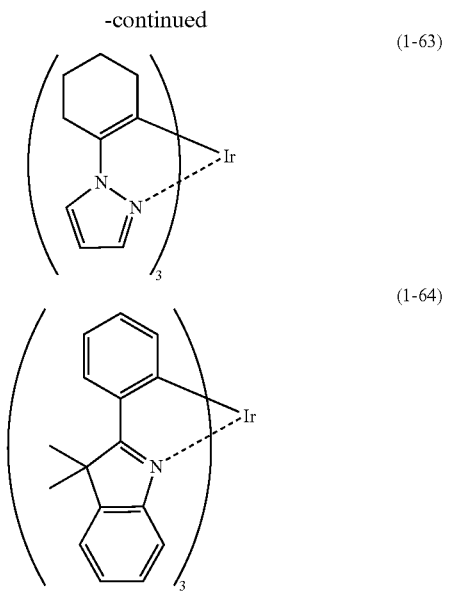

(1-63)

(1-64)

The host material used in the invention can be synthesized through various processes.

The OELD is not limited by system configuration, driving mode, use, and so forth as long as the requirements of the present invention are met.

The OELD of the invention preferably has a layer containing a compound having an IP (ionization potential) of 5.9 ev or higher (particularly 6.0 eV or higher) between the cathode and the light emitting layer. It is preferred for the OELD that the layer containing a compound having an IP (ionization potential) of 5.9 eV or higher (particularly 6.0 eV or higher) is an electron transporting layer.

Methods for forming the organic compound layers including the light emitting layer include, but are not limited to, vacuum deposition by resistance heating or electron beam, sputtering, molecular accumulation, wet coating (spray coating, dip coating, impregnation, roll coating, gravure coating, reverse coating, roll brush coating, air knife coating, curtain coating, spin coating, flow coating, bar coating, microgravure coating, air doctor coating, blade coating, squeegee coating, transfer roll coating, kiss coating, casting, extrusion coating, wire bar coating, screen coating, etc.), ink jet method, printing, and transfer. From the standpoint of film characteristics and ease of production, resistance heating vacuum deposition, wet coating, and transfer are preferred.

The OELD may have a hole injecting layer, a hole transporting layer, an electron injecting layer, an electron transporting layer, a protective layer, and so forth in addition to the light emitting layer. Each of the additional layers may have functions other than the intended one meant by the designation of the layer. Each layer can be formed of various materials according to the purpose.

The light-extraction efficiency of the OELD according to the present invention can be improved by various known techniques, such as: surface structuring of the substrate (for example, formation of a fine uneven pattern); and, in case ITO was used as an electrode, controlling the refractive index of the substrate, ITO layer or organic layer(s), and controlling the thickness of the substrate, ITO layer or organic layer(s). The improvement in light-extraction efficiency leads to an increase of external quantum efficiency.

The OELD of the invention may be of a so-called top emission type, in which light is-emitted from the cathode side of the device.

The substrate which can be used in the OELD includes, but is not limited to, inorganic materials, such as yttrium-stabilized zirconia and glass; polyesters, such as polyethylene terephthalate, polybutylene terephthalate, and polyethylene naphthalate; and polymers, such as polyethylene, polycarbonate, polyether sulfone, polyarylate, allyl diglycol carbonate, polyimide, polycycloolefins, norbornene resins, poly(chlorotrifluoroethylene), Teflon, and tetrafluoroethylene-ethylene copolymers.

The OELD according to the present invention can be used in combination with a blue light emitting device utilizing singlet excitons for light emission.

The light emitting layer may have at least one laminate structure. The number of layers to be stacked to form the light emitting layer is preferably up to 50, still preferably 4 to 30, particularly preferably 6 to 20.

The thickness of each layer constituting the light emitting layer, while not particularly limited, is preferably 0.2 to 20 nm, still preferably 0.4 to 15 nm, particularly preferably 0.5 to 10 nm, especially preferably 1 to 5 nm.

The light emitting layer may have a plurality of domain (microscopic regions constituted by materials such as the host material and the luminescent material or a mixture thereof) structures constituted by the host material, the luminescent material or other materials. The light emitting layer may have a plurality of domain structures, each of the structures being constituted by same material, or may have a plurality of domain structures, each of the structures being constituted by different material. The diameter of each domain is preferably 0.2 to 10 nm, still preferably 0.3 to 5 nm, particularly preferably 0.5 to 3 nm, especially preferably 0.7 to 2 nm.

The anode supplies positive holes to a hole injecting layer, a hole transporting layer, a light emitting layer, etc. Materials making up the anode include metals, alloys, metal oxides, electrically conductive compounds, and mixtures thereof. Those having a work function of 4 eV or higher are preferred. Examples of useful materials are electrically conductive metal oxides, such as tin oxide, zinc oxide, indium oxide, and indium tin oxide (ITO); metals, such as gold, silver, chromium, and nickel; mixtures or laminates of these metals and conductive metal oxides; inorganic electrically conductive substances, such as copper iodide and copper sulfide; organic electrically conductive substances, such as polyaniline, polythiophene, and polypyrrole; and mixtures or laminates of these materials and ITO. Conductive metal oxides are preferred. ITO is especially preferred for its productivity, electrical conductivity, and transparency.

The thickness of the anode is decided appropriately according to the material and usually ranges from 10 nm to 5 µm, preferably 50 nm to 1 µm, still preferably 100 to 500 nm.

The anode is usually used as formed on a substrate, such as a soda lime glass plate, an alkali-free glass plate or a transparent resin plate. When a glass substrate is chosen, alkali-free glass is preferred for avoiding leaching of ions from glass. In using soda lime glass, one having a barrier coat of silica, etc. is preferred. The thickness of the substrate is not particularly limited as long as the device can maintain mechanical strength. A glass substrate, for example, usually has a thickness of 0.2 mm or larger, preferably 0.7 mm or larger.

The anode is formed by an appropriate technique selected according to the material. For instance, an ITO layer is formed by electron beam deposition, sputtering, resistance heating vacuum deposition, chemical reaction (e.g., a sol-gel process) coating with an ITO dispersion, and the like.

The anode thus formed may be subjected to cleaning or a like treatment for reducing the driving voltage or increasing luminescence efficiency. For an ITO anode, for instance, a UV-ozone treatment or a plasma treatment is effective.

The cathode supplies electrons to an electron injecting layer, an electron transporting layer, a light emitting layer, etc. The material making up the cathode is selected taking into consideration adhesion to an adjacent layer, such as an electron injecting layer, an electron transporting layer or a light emitting layer, ionizing potential, stability, and the like. Useful materials include metals, alloys, metal halides, metal oxides, electrically conductive compounds, and mixtures thereof. Examples of useful materials are alkali metals (e.g., Li, Na, and K) and fluorides or oxides thereof, alkaline earth metals (e.g., Mg and Ca) and fluorides or oxides thereof, gold, silver, lead, aluminum, sodium-potassium alloys or mixtures, lithium-aluminum alloys or mixtures, magnesium-silver alloys or mixtures, and rare earth metals (e.g., indium and ytterbium). Preferred of them are those having a work function of 4 eV or less, particularly aluminum, lithium-aluminum alloys or mixtures, and magnesium-silver alloys or mixtures. The cathode may have a single layer structure made of the above-recited material or a laminate structure containing the material. For example, an aluminum/lithium fluoride laminate or an aluminum/lithium oxide laminate is preferred. The thickness of the cathode is selected appropriately according to the material and usually ranges from 10 nm to 5 μm, preferably 50 nm to 1 μm, still preferably 100 nm to 1 μm.

The cathode can be formed by electron beam deposition, sputtering, resistance heating vacuum deposition, wet coating, transfer, and like techniques. In vacuum deposition, a single metal may be deposited, or two or more components may be deposited simultaneously. A plurality of metals may be deposited simultaneously to form an alloy cathode, or a previously formulated alloy may be deposited.

The anode and the cathode each preferably have as low sheet resistance as possible, particularly a sheet resistance lower than several hundreds of ohms per square.

In addition to the host material and the luminescent material according to the present invention, the light emitting layer may further contain any other material as long as the layer performs a function of receiving holes from the anode or a hole injecting/transporting layer while receiving electrons from the cathode or an electron injecting/transporting layer, a function of transporting the injected holes or electrons, and a function of a supplying a site for allowing the holes and the electrons to be recombined thereby emitting light. The other materials the light emitting layer may contain include benzoxazole, benzimidazole, benzothiazole, styrylbenzene, polyphenyl, diphenylbutadiene, tetraphenylbutadiene, naphthylimide, coumarin, perylene, perinone, oxadiazole, aldazine, pyrralidine, cyclopentadiene, bisstyrylanthracene, quinacridone, pyrrolopyridine, thiadiazolopyridine, cyclopentadiene, styrylamine, aromatic dimethylidyne compounds; polymers, such as polythiophene, polyphenylene, and polyphenylene vinylene; various metal complexes, such as 8-quinolinol metal complexes, rare earth complexes, and transition metal complexes (e.g., tris(phenylpyridine)iridium and platinum porphyrin complex); and derivatives of these compounds. The thickness of the light emitting layer is not particularly limited and usually ranges from 1 nm to 5 μm, preferably 5 nm to 1 μm, still preferably 10 to 500 nm.

Methods of forming the light emitting layer include, but are not limited to, vacuum deposition by resistance heating or electron beam, sputtering, molecular accumulation, wet coating, ink jet method, printing, LB method, and transfer. Resistance heating vacuum deposition and wet coating are preferred.

The solvent which can be used in wet coating is preferably capable of uniformly dissolving or dispersing both the host material and the luminescent material. It is preferred that the light emitting layer to have the host material and the luminescent material in a uniformly dispersed state.

The OLED can have one or more light emitting layers. The two or more light emitting layers may emit light of different colors to emit, for example, white light as a whole. A single light emitting layer can be designed to emit white light.

The hole injecting layer and the hole transporting layer can be of any materials having a function of injecting holes supplied by the anode, a function of transporting the holes or a function of blocking the electrons injected from the cathode. Examples of such materials include carbazole, triazole, oxazole, oxadiazole, imidazole, polyarylalkanes, pyrazoline, pyrazolone, phenylenediamine, arylamines, amino-substituted chalcones, styrylanthracene, fluorenone, hydrazone, stilbene, silazane, aromatic tertiary amine compounds, styrylamine compounds, aromatic dimethylidyne compounds, porphyrin compounds, polysilane compounds, poly(N-vinylcarbazole), aniline copolymers; conductive oligomers or polymers, such as thiophene oligomers and polythiophene; organic silane compounds; carbon films, the compounds of the present invention; and derivatives of the recited compounds. The thickness of the hole injecting layer and the hole transporting layer is not particularly limited and usually ranges from 1 nm to 5 μm, preferably 5 nm to 1 μm, still preferably 10 to 500 nm. The hole injecting layer and the hole transporting layer may each have a single layer structure made of one or more of the above-recited materials or a multilayer structure composed of two or more layers having the same or different compositions.

The hole injection layer and the hole transporting layer can be formed by vacuum evaporation, LB method, wet coating with a solution or dispersion of the hole injecting/transporting material in a solvent, ink jet method, printing or transfer. Where wet coating techniques are adopted, it is possible to apply a resin component as dissolved or dispersed in the solvent together with the hole injecting/transporting material. Applicable resin components include polyvinyl chloride, polycarbonate, polystyrene, polymethyl methacrylate, polybutyl methacrylate, polyester, polysulfone, polyphenylene oxide, polybutadiene, poly(N-vinylcarbazole), hydrocarbon resins, ketone resins, phenoxy resins, polyamide, ethyl cellulose, polyvinyl acetate, ABS resins, polyurethane, melamine resins, unsaturated polyester resins, alkyd resins, epoxy resins, and silicone resins.

The electron injecting layer and the electron transporting layer can be made of any materials that perform at least one of a function of injecting electrons from the cathode, a function of transporting the electrons, and a function of blocking positive holes from the anode. Such materials include triazole, oxazole, oxadiazole, imidazole, fluorenone, anthraquinodimethane, anthrone, diphenylquinone, thiopyran dioxide, carbodiimide, fluorenylidenemethane, distyrylpyrazine, aromatic (e.g., naphthalene or perylene) tetracarboxylic acid anhydrides, phthalocyanine, various metal complexes, such as metal complexes of 8-quinolinol derivatives, metallo-phthalocyanines, and metal complexes having benzoxazole or benzothiazole as a ligand, organic silane compounds, and derivatives of the recited compounds. The thickness of the electron injecting layer and the electron transporting layer is not particularly limited and usually ranges from 1 nm to 5 µm, preferably 5 nm to 1 µm, still preferably 10 to 500 nm. The electron injecting layer and the electron transporting layer may each have a single layer structure made of one or more of the above-recited materials or a multilayer structure composed of two or more layers having the same or different compositions.

The electron injecting layer and the electron transporting layer can be formed by vacuum evaporation, LB method, wet coating with a solution or dispersion of the electron injecting/transporting material in a solvent, ink jet method, printing, transfer or like techniques. Where wet coating techniques are adopted, it is possible to apply a resin component as dissolved or dispersed in the solvent together with the hole injecting/transporting material. Applicable resin components include those described above with respect to the hole injecting/transporting layers.

The protective layer can be of any material that prevents substances which may accelerate deterioration of the device, such as moisture and oxygen, from entering the device. Such materials include metals, e.g., In, Sn, Pb, Au, Cu, Ag, Al, Ti, and Ni; metal oxides, e.g., MgO, SiO, $SiO_2$, $Al_2O_3$, GeO, NiO, CaO, BaO, $Fe_2O_3$, $Y_2O_3$, and $TiO_2$; metal fluorides, e.g., $MgF_2$, LiF, $AlF_3$, and $CaF_2$; nitrides, e.g., $SiN_x$ and $SiO_xN_y$; polyethylene, polypropylene, polymethyl methacrylate, polyimide, polyurea, polytetrafluoroethylene, polychlorotrifluoroethylene, polydichlorodifluoroethylene, chlorotrifluoroethylene-dichlorodifluoroethylene copolymers, tetrafluoroethylene copolymers, fluorine-containing copolymers having a cyclic structure in the main chain thereof; water absorbing substances having a water absorption of at least 1%; and moisture-proof substances having a water absorption of 0.1% or less.

Methods for forming the protective layer include, but are not limited to, vacuum evaporation, sputtering, reactive sputtering, molecular beam epitaxy, cluster ion beam-assisted deposition, ion plating, plasma polymerization (radiofrequency-excited ion plating), plasma-enhanced CVD, laser-assisted CVD, thermal CVD, gas source CVD, wet coating techniques, printing, and transfer.

EXAMPLES

The present invention will now be illustrated in greater detail with reference to Examples, but it should be understood that the present invention is not deemed to be limited thereto.

Example 1

N,N'-Diphenyl-N,N'-di(o-tolyl)benzidine (TPD) was deposited on an ITO substrate by vacuum evaporation to a thickness of 50 nm. Compound (1-12) and $Ir(ppy)_3$ (tris-ortho-metalated complex of iridium (III) with 2-phenylpyridine) were vacuum co-deposited on the TPD layer at a weight ratio of 17:1 to a deposition thickness of 36 nm. Compound A shown below was vacuum deposited thereon to a thickness of 36 nm. A pattern mask (having a pattern giving a light-emitting area of 4 mm by 5 mm) was put on the thus formed organic thin film, and a cathode was deposited (lithium fluoride was vacuum deposited to a thickness of about 1 nm, and aluminum was then vacuum deposited to a thickness of about 200 nm) to complete a device. On applying a constant DC voltage to the resulting OLED by use of Source-Measure Unit Model 2400 supplied by Toyo Corp., green light emission was obtained, which had CIE chromaticity coordinates of x=0.29 and y=0.62 as measured with Spectral Analyzer PMA-11 supplied by Hamamatsu Photonics K.K. and a luminance of 2700 cd/m² at 12 V as measured with a luminance meter BM-8 supplied by Topcon.

Compound A:

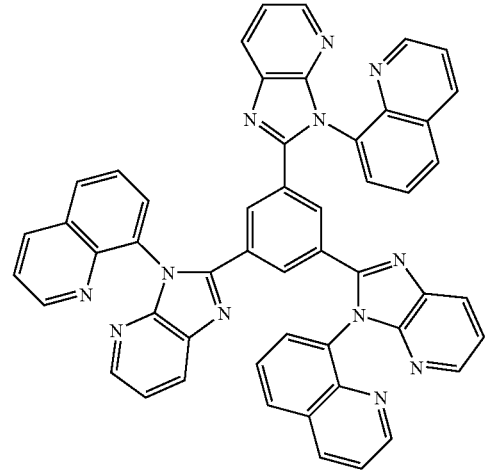

Comparative Example 1

Copper phthalocyanine was vacuum deposited on a cleaned ITO substrate toadeposit thickness of 10 nm. NPD was deposited thereon to a thickness of 50 nm. 4,4'-N,N'-Dicarbazole-biphenyl (CBP) and $Ir(ppy)_3$ were co-deposited at a weight ratio of 10:1 on the NPD layer. Compound B shown below was then deposited to a thickness of 36 nm. Finally, a cathode was formed in the same manner as in Example 1 to produce an OELD. The device emitted green light having an $EL_{max}$ of 515 nm.

Compound B:

CBP

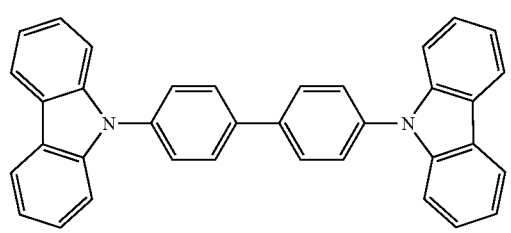

Compound B

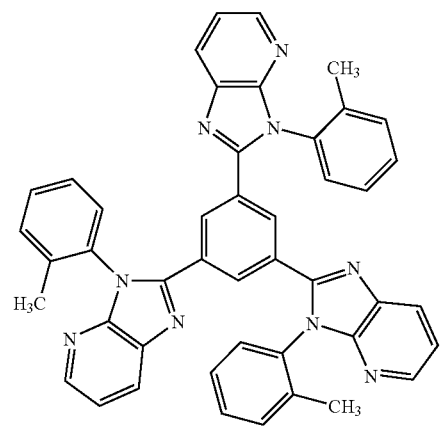

Compound C

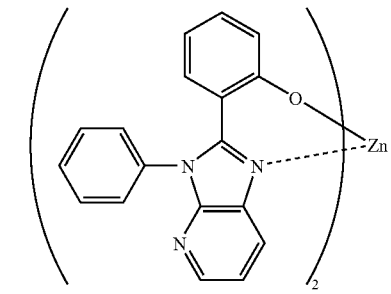

Compound D

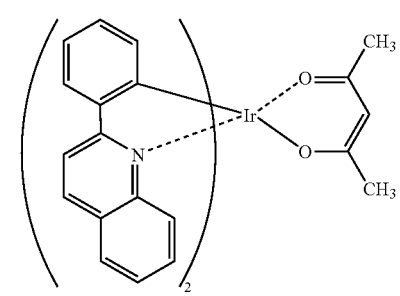

Compound E

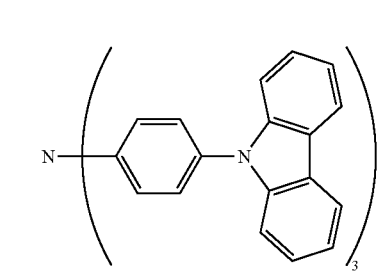

-continued

Compound F

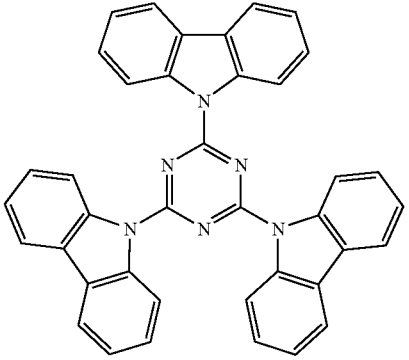

Example 2

An OELD was prepared and evaluated in the same manner as in Comparative Example 1, except for replacing CBP with compound (1-24). The device emitted green light having an $EL_{max}$ of 515 nm assigned to Ir(ppy)$_3$. The driving voltage for obtaining luminescence of 100 cd/m² was lower by about 1 V than in Comparative Example 1. The number of dark spots was less than in Comparative Example 1.

Example 3

An OELD was prepared and evaluated in the same manner as in Comparative Example 1, except for replacing CBP with compound (1-25). The device emitted green light having an $EL_{max}$ of 515 nm assigned to Ir(ppy)$_3$. The driving voltage for obtaining luminescence of 100 cd/m² was lower by about 1 V than in Comparative Example 1. The number of dark spots was less than in Comparative Example 1.

Example 4

An OELD was prepared and evaluated in the same manner as in Comparative Example 1, except for replacing CBP with compound (1-49) ($T_1$=67 kcal/mol). The device emitted green light having an $EL_{max}$ of 515 nm assigned to Ir(ppy) 3. The driving voltage for obtaining luminescence of 100 cd/m² was lower by about 1 V than in Comparative Example 1. The number of dark spots was less than in Comparative Example 1.

Example 5

An OELD was prepared and evaluated in the same manner as in Comparative Example 1, except for replacing CBP with a 1:2 (by weight) mixture of compound (1-49) and compound C shown above. The device emitted green light having an $EL_{max}$ of 515 nm assigned to Ir (ppy)$_3$. The driving durability of the device at a luminance of 500 cd/r² was evaluated. The half decay time was about twice that of the device of Comparative Example 1. The driving voltage for obtaining luminescence of 100 cd/m² was lower by about 1 V than in Comparative Example 1.

Example 6

An OELD was prepared and evaluated in the same manner as in Comparative Example 1, except for replacing CBP with a 1:1 (by weight) mixture of compound (1-49) and compound E shown above. The device emitted green light having an $EL_{max}$ of 515 nm assigned to $Ir(ppy)_3$. The driving durability of the device at a luminance of 500 cd/m$^2$ was evaluated. The half decay time was about 1.5 times that of the device of Comparative Example 1. The driving voltage for obtaining luminescence of 100 cd/m$^2$ was lower by about 1 V than in Comparative Example 1.

Example 7

An OELD was prepared and evaluated in the same manner as in Comparative Example 1, except for replacing CBP with a 1:2 (by weight) mixture of compound (1-38) and compound F shown above. The device emitted green light having an $EL_{max}$ of 515 nm assigned to $Ir(ppy)_3$. The driving durability of the device at a luminance of 500 cd/m$^2$ was evaluated. The half decay time was about 1.5 times that of the device of Comparative Example 1. The driving voltage for obtaining luminescence of 100 cd/m$^2$ was lower by about 1 V than in Comparative Example 1.

Example 8

An OELD was prepared and evaluated in the same manner as in Comparative Example 1, except for replacing CBP with compound (1-23) and replacing $Ir(ppy)_3$ with compound D shown above. The device emitted red light.

Example 9

An OELD was prepared and evaluated in the same manner as in Comparative Example 1, except for replacing CBP with compound (1-28) and replacing $Ir(ppy)_3$ with compound (1-24). The device emitted blue light.

The present invention provides an OELD having a high luminance, a high external quantum efficiency, and excellent durability.

This application is based on Japanese Patent application JP 2002-382454, filed Dec. 27, 2002, the entire content of which is hereby incorporated by reference, the same as if set forth at length.

What is claimed is:

1. An organic electroluminescent device comprising:
   a pair of electrodes; and
   at least one organic compound layer between the pair of electrodes, the at least one organic compound layer including a light emitting layer,
   wherein the light emitting layer contains at least one host material and at least one luminescent material, wherein the luminescent material is a phosphorescent material that is an iridium complex, a platinum complex, a rhenium complex, a ruthenium complex, a palladium complex or a rhodium complex and the host material is a metal complex containing a metal in groups 4 to 11 of a Periodic Table and the host material is present in the light emitting layer in an amount of 50 to 99.9% by weight;
   wherein the host material is a compound selected from the group consisting of a compound represented by the formula (II), a compound represented by the formula (III), a compound represented by the formula (IV), a compound represented by the formula (V), and a compound represented by the formula (VI):

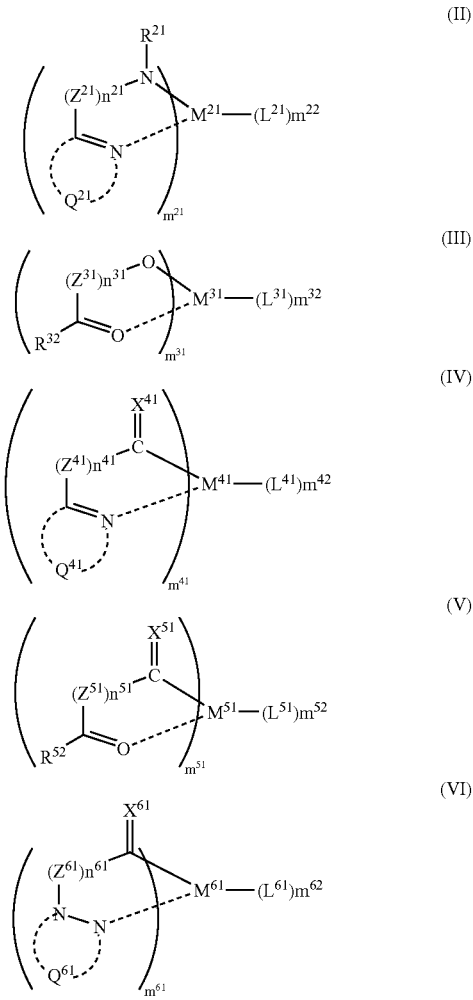

wherein $Q^{21}$, $Q^{41}$, and $Q^{61}$ each independently represent an atomic group necessary to form a nitrogen-containing heterocyclic ring; $Z^{21}$, $Z^{31}$, $z^{41}$, $Z^{51}$, and $Z^{61}$ each independently represent a linking group; $M^{21}$, $M^{31}$, $M^{41}$, $M^{51}$, and $M^{61}$ each independently represent an ion of a metal in groups 4 to 11 of a Periodic Table; $L^{21}$, $L^{31}$, $L^{41}$, $L^{51}$, and $L^{61}$ each independently represent a ligand; $R^{21}$, $R^{32}$, and $R^{52}$ each independently represent a hydrogen atom or a substituent; $X^{41}$, $X^{51}$, and $X^{61}$ each independently represent a substituted carbon atom or a substituted nitrogen atom; $n^{21}$, $n^{31}$, $n^{41}$, $n^{51}$, and $n^{61}$ each independently represent an integer of 0 to 2; $m^{21}$, $mm^{31}$, $m^{41}$, $m^{51}$, and $m^{61}$ each independently represent an integer of 1 to 4; and $m^{22}$, $m^{32}$, $m^{42}$, $m^{52}$, and $m^{62}$ each independently represent integer of 0 to 6.

2. The organic electroluminescent device of claim 1, wherein the metal of the metal complex for the host material is selected from the group consisting of titanium, iron, manganese, nickel, copper, zirconium, molybdenum, ruthenium, rhodium, palladium, silver, tungsten, rhenium, osmium, iridium, platinum and gold as a center metal.

3. The organic electroluminescent device of claim 2, wherein the host material and the phosphorescent material have a $T_1$ value of 60 kcal/mol or higher, and the phosphorescent material emits phosphorescence having a peak wavelength of 550 nm or shorter.

4. The organic electroluminescent device of claim 1, wherein the at least one organic compound layer is at least three organic compound layers including a hole transporting layer, a light emitting layer, and an electron transporting layer, and the electron transporting layer contains a compound having an IP value of 5.9 eV or higher.

5. The organic electroluminescent device of claim 1, wherein the metal of the metal complex of the host material is selected from the group consisting of rhodium, palladium, rhenium, iridium, and platinum as a center metal.

6. The organic electroluminescent device of claim 1, wherein the metal of the metal complex of the host material is selected from the group consisting of rhodium and palladium as a center metal.

7. The organic electroluminescent device of claim 1, wherein the host material and the phosphorescent material have a $T_1$ value of 60 kcal/mol or higher, and the phosphorescent compound emits phosphorescence having a peak wavelength of 550 nm or shorter.

8. The organic electroluminescent device of claim 1, wherein the at least one organic compound layer is at least three organic compound layers including a hole transporting layer, a light emitting layer, and an electron transporting layer, and the electron transporting layer contains a compound having an IP value of 5.9 eV or higher.

9. The organic electroluminescent device of claim 1, wherein the light emitting layer is free from a fluorescent compound, and the phosphorescent material substantially emits light.

* * * * *